(12) United States Patent
Kim

(10) Patent No.: US 6,861,743 B2
(45) Date of Patent: Mar. 1, 2005

(54) INTEGRATED CIRCUIT CARRIER SOCKET

(75) Inventor: David Kwang-Jae Kim, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 201 days.

(21) Appl. No.: 10/262,320

(22) Filed: Sep. 30, 2002

(65) Prior Publication Data

US 2004/0061216 A1 Apr. 1, 2004

(51) Int. Cl.[7] .............................................. H01L 23/48
(52) U.S. Cl. ....................... 257/697; 257/688; 257/710; 257/711; 257/713; 257/728; 257/730; 257/731
(58) Field of Search ............................... 257/697, 713, 257/730, 731, 98, 181, 418, 688, 710, 711, 728

(56) References Cited

U.S. PATENT DOCUMENTS

| | | | | |
|---|---|---|---|---|
| 4,535,887 A | * | 8/1985 | Egawa | 206/328 |
| 4,549,651 A | * | 10/1985 | Alemanni | 206/329 |
| 4,618,739 A | * | 10/1986 | Theobald | 257/E23.067 |
| 4,681,221 A | * | 7/1987 | Chickanosky et al. | 206/328 |
| 4,803,828 A | * | 2/1989 | Tan et al. | 53/390 |
| 4,872,845 A | * | 10/1989 | Korsunsky et al. | 439/70 |
| 4,889,499 A | * | 12/1989 | Sochor | 439/268 |
| 4,970,781 A | * | 11/1990 | Chang et al. | 257/697 |
| 5,067,911 A | * | 11/1991 | Saeki | 439/526 |
| 5,088,942 A | * | 2/1992 | Welsh et al. | 439/843 |
| 5,102,829 A | * | 4/1992 | Cohn | 257/697 |
| 5,254,012 A | * | 10/1993 | Wang | 439/263 |
| 5,257,165 A | * | 10/1993 | Chiang | 361/748 |
| 5,481,436 A | * | 1/1996 | Werther | 361/784 |
| 6,168,454 B1 | * | 1/2001 | Dzwonczyk | 439/381 |
| 2002/0055305 A1 | * | 5/2002 | Williams | 439/851 |

* cited by examiner

*Primary Examiner*—David Nelms
*Assistant Examiner*—Andy Huynh
(74) *Attorney, Agent, or Firm*—Blakely Sokoloff Taylor & Zafman LLP

(57) ABSTRACT

According to one embodiment, an apparatus is disclosed. The apparatus comprises an integrated circuit (IC) having a plurality of connection pins, a carrier socket configured to carry the IC. The carrier socket protects the pins of the IC from bending. In addition, the carrier socket straightens pins that have been bent prior to placing the IC into the carrier socket.

19 Claims, 5 Drawing Sheets

US 6,861,743 B2

INTEGRATED CIRCUIT CARRIER SOCKET

FIELD OF THE INVENTION

The present invention relates to integrated circuits (ICs); more particularly, the present invention relates to the carrying and handling of ICs.

BACKGROUND

Pin grid arrays (PGAs) are integrated circuit packages that have pins arrayed in a series of square-within-square grids at the bottom. The square-pin design enables a computer hardware technician to smoothly plug the PGA into an associated socket on a computer system motherboard using little to no force.

Prior to a PGA being inserted into a socket for operation, PGAs are carried in a plastic tray with pocketed cavities. However, packing PGAs in such a tray during transportation and handling typically results in many of the pins at the bottom of the PGA being bent or broken, thus, ruining a particular PGA. PGAs are expensive, thus, being susceptible to pin bending or breakage often leads to higher manufacturing costs for replacements. In addition, bent PGAs may lead to the damage of sockets on a computer system motherboard on which a PGA is placed during operation.

Therefore, a PGA carrying mechanism is desired.

SUMMARY

According to one embodiment, an apparatus is disclosed. The apparatus comprises an integrated circuit (IC) having a plurality of connection pins, carrier socket configured to carry the IC. The carrier socket protects the pins of the IC from bending. In addition, the carrier socket straightens pins that have been bent prior to placing the IC into the carrier socket.

According to a further embodiment, the carrier socket includes a holder that secures the IC and a housing that secures the holder and the IC. The holder includes a plurality of tines to hold the plurality of pins of the IC. The tines are tapered to straighten one or more bent pins. Further, the housing includes a plurality of tapered holes to guide the tines and the pins into the housing.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

An integrated circuit (IC) carrier socket is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
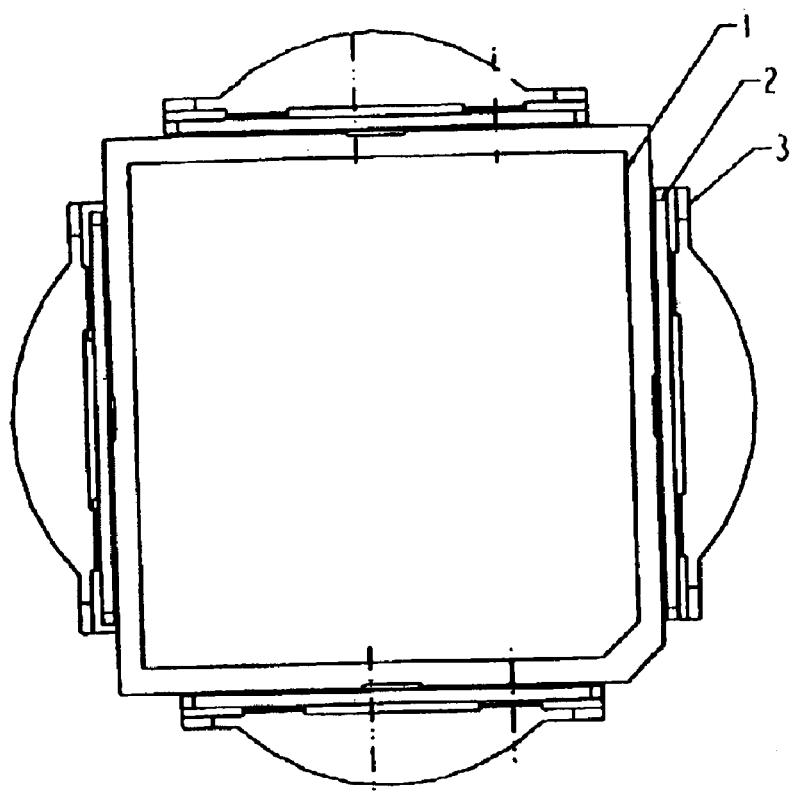
FIG. 1 illustrates a top view of one embodiment of an integrated circuit (IC) mounted within an IC carrier socket.

FIG. 1 illustrates a top view of one embodiment of an IC 1 mounted within an IC carrier socket. According to one embodiment, the IC 1 is a micro-pin grid array (micro-PGA). In a further embodiment, IC 1 includes 959 pins arrayed in a series of square grids. In another embodiment, IC 1 may be implemented as a PGA, or other type of microprocessor or integrated circuit. However, one of ordinary skill in the art will appreciate that IC 1 may be implemented in other forms without departing from the true scope of the invention.

Figure 2:
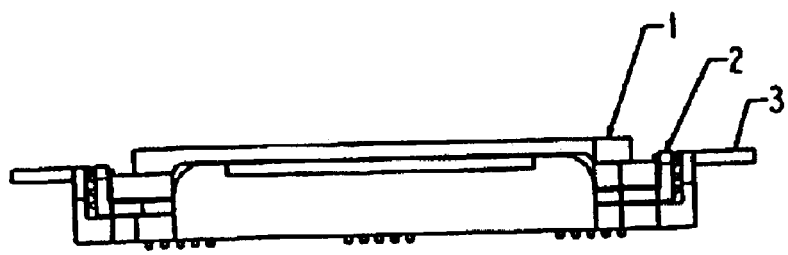
FIG. 2 illustrates a side view of one embodiment of an IC mounted within a carrier socket.

The IC carrier socket includes a holder 2 and a housing 3. According to one embodiment, holder 2 and housing 3 protect against pins of IC 1 bending during handling and transport. FIG. 2 illustrates a side view of one embodiment of IC 1 mounted within holder 2, which is in turn mounted within housing 3. In one embodiment, the holder 2 and housing 3 assembly accommodates various types of pin diameters and lengths for IC 1.

Figure 3:
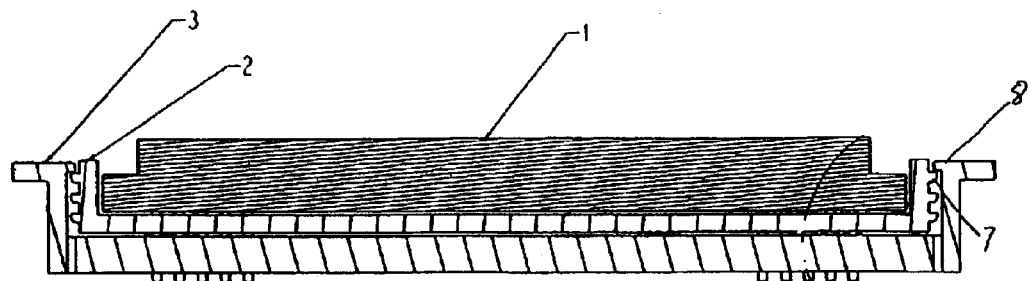
FIG. 3 illustrates a detailed side view of one embodiment of an IC mounted within a carrier socket.

FIG. 3 illustrates a detailed side view of one embodiment of IC 1 mounted within holder 2 and housing 3. In particular, FIG. 3 shows a holder 2 and a housing 3 interlocking mechanism. According to one embodiment, holder 2 includes one or more latches 7 at each end of holder 2, while housing 3 includes latches 8.

Upon inserting the IC 1, holder 2 assembly into housing 3, latch 8 of housing 3 interlocks with a latch 7 on holder 2 to hold IC 1, holder 2 and housing 3 together. In a further embodiment, the interlocking mechanism provides for variable sizes of ICs 1 to be placed in housing 3. For example, the larger the IC 1, a lower latch 7 on holder 2 is used to engaged with latch 8.

Figure 4:
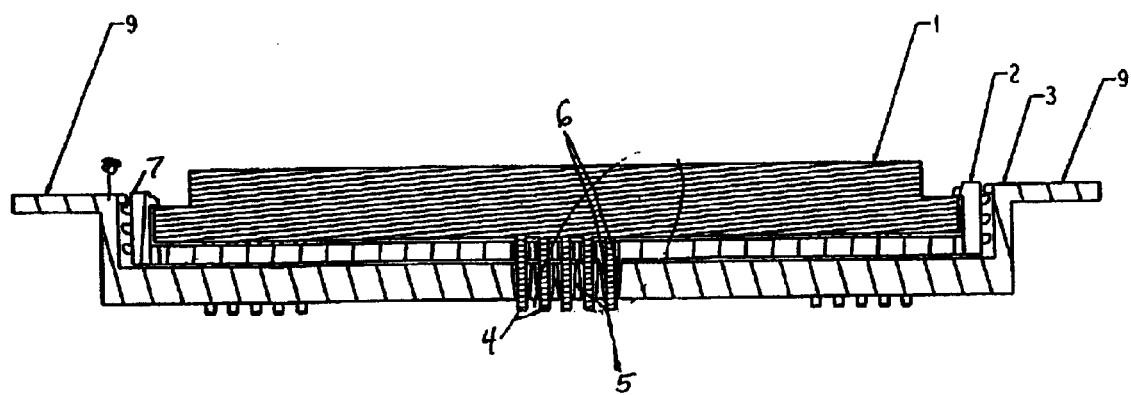
FIG. 4 illustrates another detailed side view of one embodiment of an IC mounted within a carrier socket.

FIG. 4 illustrates another detailed side view of one embodiment of IC 1 mounted within holder 2 and housing 3. FIG. 4 shows housing 3 having tabs 9 on each side that releases the holder 2, housing 3 interlocking mechanism. For instance, a user may depress tabs 9 at each side of housing 3 with the thumbs to release the IC 1, holder 2 combination. As a result, each latch 8 releases the interconnected latch 7.

Figure 6:
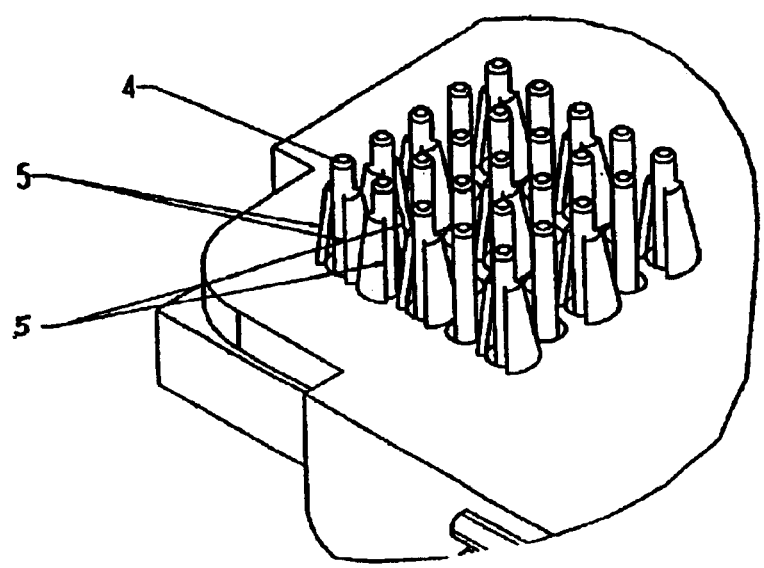
FIG. 6 illustrates one embodiment of a holder.
Figure 8:
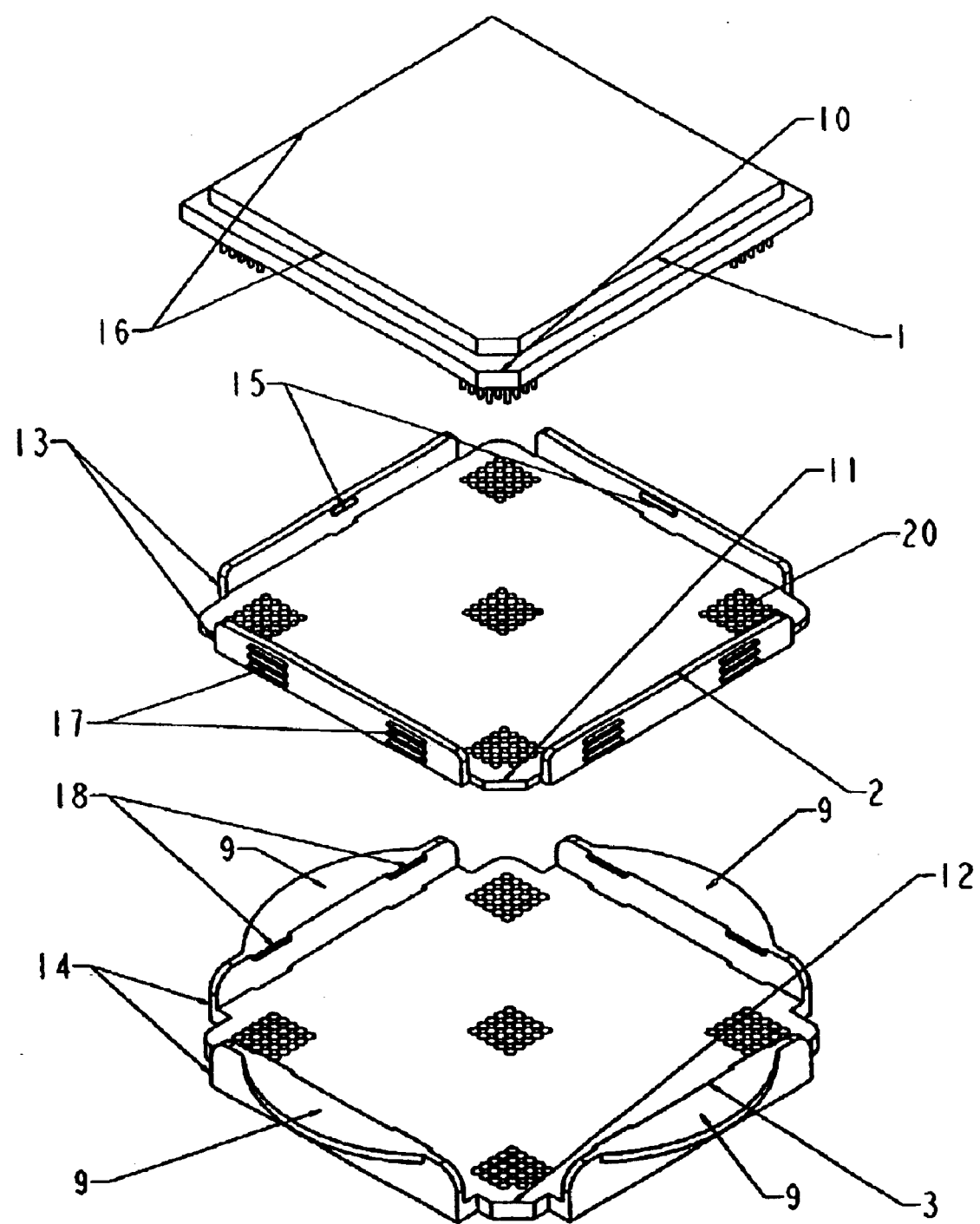
FIG. 8 illustrates another exploded view of one embodiment of an IC a holder and a housing.

In addition, FIG. 4 shows holder 2 having tines 5 that hold pins 4 of IC 1. FIG. 8 illustrates a reverse angle of IC 1 mounted in one embodiment of holder 2. Thus, FIG. 6 provides greater detail of pins 4 secured within tines 5. According to one embodiment, tines 5 are constructed of a flexible plastic material that is tapered to firmly grip pins 4.

Figure 7:
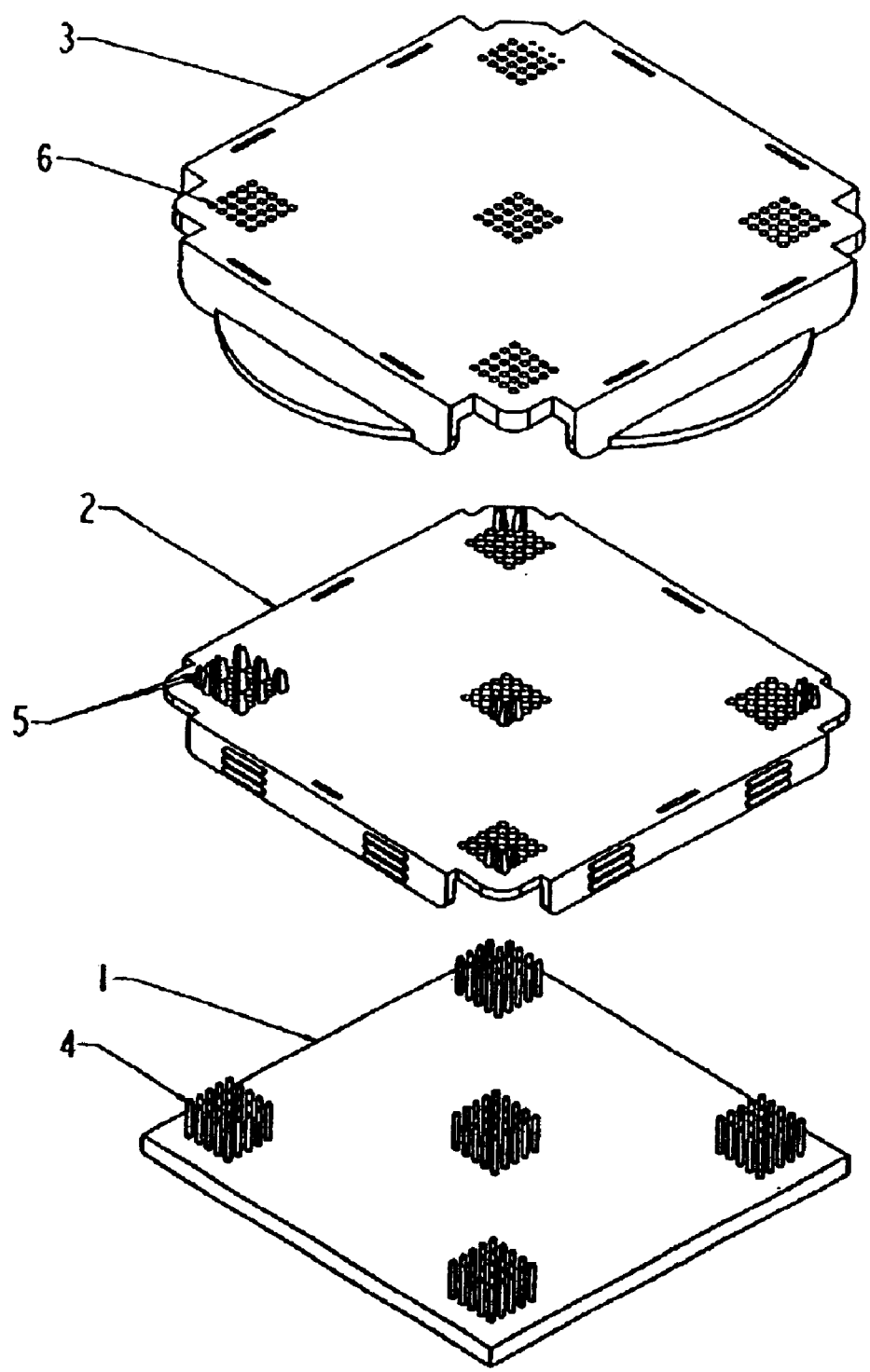
FIG. 7 illustrates an exploded view of one embodiment of an IC a holder and a housing.

In a further embodiment, tines 5 are tapered to enable the straightening of pins 4 if one or more pins 4 are bent. Referring back to FIG. 4, housing 3 includes holes 6 that are tapered to guide the pins 4, tines 5 combination into housing 3. FIG. 7 illustrates an exploded view of one embodiment of IC 1, holder 2 and housing 3, which shows a more detailed view of pins 4, tines 5 and holes 6.

Figure 5:
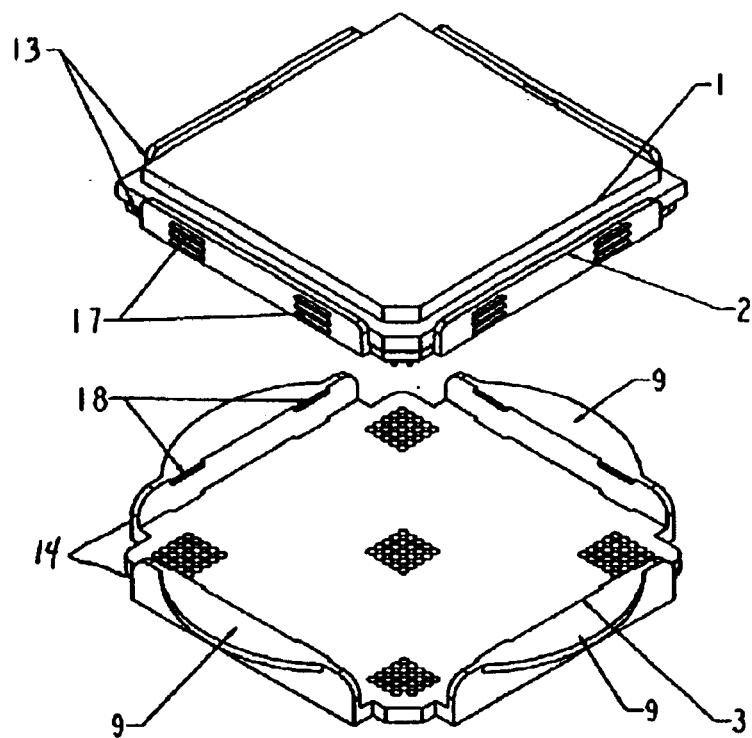
FIG. 5 illustrates an exploded view of one embodiment of an IC with a carrier socket.

FIG. 5 illustrates an exploded view of one embodiment of the IC 1, holder 2 combination and housing 3. This figure shows how holder 2 fits within housing 3. In one embodiment, holder 2 has sides 13 that surround IC 1 once IC 1 is inserted within holder 2. The sides 13 include a series of latches 17 that are used to secure holder 2 to housing 3.

Similarly, housing 3 includes sides 14 that surround holder 2 once the IC 1/holder 2 combination is inserted within housing 3. The sides 14 include latches 18 that engage the latches 17 to secure holder 2. As described above, variable sizes of ICs 1 to be placed in housing 3. Thus, the series of latches account for the variance in IC 1 sizes. For example, the larger the IC 1, a lower latch 17 on holder 2 is used to engaged with latch 18 on housing 3.

FIG. 8 illustrates an exploded view of one embodiment of IC 1, holder 2 and housing 3. According to one embodiment, housing 2 includes snaps 15 to firmly hold IC 1. Particularly, snaps 15 snap over a heatsink 16 of IC 1. Additionally, holder 2 includes holes 20. Holes 20 are large holes with rounded edges in order to facilitate the insertion of pins 4 into holder 2. In a further embodiment, holder 2 and housing 3 include notches 11 and 12, respectively that enable a used to easily remove IC 1.

For insertion of an IC 1 into the carrier socket, the IC 1 is positioned in alignment with the large holes 20 of holder 2. As discussed above, the holes 20 have rounded edges to enable the insertion of the IC 1 pins 4. Subsequently, the snaps 25 engage the IC 1, holding the IC 1 firmly. Next, the flexible tapered tines 5 of holder 2 firmly grip the pins 4. The pins 4 and tines 5 are inserted into the tapered holes 6 to assist in the self-aligning and self-centering of the pins 4. The latches 7 and 17 of holder 2 interlock with latches 8 and 18, respectively, of housing to hold IC 1, holder 2 and housing 3 together.

To remove the IC 1 from the carrier socket, a user presses thumb tabs 9 to unlatch housing 3 from holder 2 and use the reverse operations shown above. Finally, the user can remove the IC 1 by lifting the IC 1 at the notched edges 11 and 12.

The above-described carrier socket protects the high pin count ICs with variable pin diameters and lengths from damage due to the handling and misusing at manufacturing sites. Moreover, the carrier socket straightens the pins of such ICs if one or more pins have been bent.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. An apparatus comprising:
   an integrated circuit (IC) having a plurality of connection pins; and
   a carrier socket configured to carry the IC, the carrier socket including a plurality of tines to protect the pins of the IC from bending and to straighten pins that have been bent prior to the IC being inserted into the carrier socket.

2. The apparatus of claim 1 wherein the carrier socket comprises:
   a holder that secures the IC; and
   a housing to secure the holder and the IC.

3. The apparatus of claim 2 wherein the holder comprises the plurality of tines.

4. The apparatus of claim 3 wherein the tines are tapered to straighten one or more bent pins.

5. The apparatus of claim 4 wherein the housing comprises a plurality of tapered holes to guide the tines and the pins into the housing.

6. The apparatus of claim 2 wherein the holder comprises one or more snaps to interlock the housing and the IC.

7. The apparatus of claim 6 wherein the housing and the holder each comprise a plurality of latches at each end to interlock the housing with the holder and the IC.

8. The apparatus of claim 7 wherein the housing further comprises tabs to release the latches.

9. The apparatus of claim 6 wherein the housing and the holder each comprise a plurality of side latches to interlock the housing with the holder.

10. The apparatus of claim 1 wherein the IC is a pin grid array (PGA).

11. The apparatus of claim 1 wherein the IC is a micro-pin grid array (micro-PGA).

12. A carrier socket comprising:
    a holder to secure an integrated circuit (IC), and including a plurality of tines to protect the pins of the IC from bending, and to straighten bent pins of the IC; and
    a housing to secure the holder and the IC.

13. The carrier socket of claim 12 wherein the holder comprises:
    a plurality of holes to facilitate the insertion of the IC pins.

14. The carrier socket of claim 13 wherein the tines are tapered to straighten one or more bent pins.

15. The carrier socket of claim 14 wherein the housing comprises a plurality of tapered holes to guide the tines and the pins into the housing.

16. The carrier socket of claim 13 wherein the holder comprises one or more snaps to interlock the housing and the IC.

17. The carrier socket of claim 16 wherein the housing and the holder each comprise a plurality of latches at each end to interlock the housing with the holder and the IC.

18. The carrier socket of claim 17 wherein the housing further comprises tabs to release the latches.

19. The carrier socket of claim 16 wherein the housing and the holder each comprise a plurality of side latches to interlock the housing with the holder.

* * * * *